United States Patent [19]

Yamada

[11] Patent Number: 5,349,290
[45] Date of Patent: Sep. 20, 1994

[54] METHOD FOR TESTING SEMICONDUCTOR INTEGRATED CIRCUIT DEVICE, VOLTAGE DROP POWER SUPPLY CIRCUIT SUITABLE FOR THE METHOD, AND SEMICONDUCTOR INTEGRATED CIRCUIT DEVICE HAVING THE VOLTAGE DROP CIRCUIT

[75] Inventor: Toyonobu Yamada, Kawasaki, Japan

[73] Assignee: Fujitsu Limited, Kawasaki, Japan

[21] Appl. No.: 52,620

[22] Filed: Apr. 27, 1993

[30] Foreign Application Priority Data

Apr. 27, 1992 [JP] Japan ................................ 4-107753

[51] Int. Cl.$^5$ ............................................... G01R 31/28
[52] U.S. Cl. ............................... 324/158.1; 324/73.1
[58] Field of Search ........... 324/158 R, 158 T, 158 F, 324/73.1; 371/22.5

[56] References Cited

U.S. PATENT DOCUMENTS

| | | | |
|---|---|---|---|
| 5,030,905 | 7/1991 | Figal | 324/158 R |
| 5,083,083 | 1/1992 | El-Ayat et al. | 324/158 R |
| 5,097,206 | 3/1992 | Perner | 324/158 R |
| 5,111,136 | 5/1992 | Kawashima | 324/158 T |

FOREIGN PATENT DOCUMENTS 3840225  5/1990  Fed. Rep. of Germany .
4007187  9/1990  Fed. Rep. of Germany .

Primary Examiner—Ernest F. Karlsen
Attorney, Agent, or Firm—Staas & Halsey

[57] ABSTRACT

In a voltage drop power supply circuit for a semiconductor integrated circuit device, a first unit generates a constant internal power supply voltage from an external power supply voltage in accordance with a first characteristic line defining a relationship between the external power supply voltage and the internal power supply voltage, and applies the constant internal power supply voltage to internal circuits of the semiconductor integrated circuit device. A second unit generates a burn-in voltage from the external power supply voltage having a level higher than that used in the normal operation in accordance with a second characteristic line defining a relationship between the external power supply voltage and the internal power supply line, and applies the burn-in voltage to the internal circuits when a burn-in test is carried out for the semiconductor integrated circuit device. The second characteristic line crosses the first characteristic line at an intermediate point between lower and upper limit voltages defined by the first characteristic line. The burn-in voltage is greater than the internal power supply voltage used in the normal operation.

17 Claims, 13 Drawing Sheets

METHOD FOR TESTING SEMICONDUCTOR INTEGRATED CIRCUIT DEVICE, VOLTAGE DROP POWER SUPPLY CIRCUIT SUITABLE FOR THE METHOD, AND SEMICONDUCTOR INTEGRATED CIRCUIT DEVICE HAVING THE VOLTAGE DROP CIRCUIT

BACKGROUND OF THE INVENTION

1. Field of the invention

The present invention generally relates to a method for testing semiconductor integrated circuit devices, and to a voltage drop power supply circuit suitable for the test. More particularly, the present invention is concerned with a method for testing semiconductor integrated circuit devices in order to detect an initial fault in the devices by applying an acceleration voltage (burn-in voltage) higher than a normal operation voltage to internal structural elements of the devices, and is concerned with a voltage drop power supply circuit provided in the devices and suitable for such a voltage acceleration test. Further, the present invention is concerned with semiconductor integrated circuit devices having voltage drop power supply circuits as described above.

2. Description of the Prior Art

A recent demand to increase the integration density of semiconductor integrated circuit devices requires diminished size of MOS (Metal Oxide Semiconductor) transistors formed on chips of the devices. Such fine MOS transistors have a large electric field between the source and drain, and this results in hot carriers. Such a hot carrier affects the MOS transistors and may damage the MOS transistors, so that the reliability of the MOS transistors is degraded. With the above in mind, an improvement has been proposed in which an external power supply voltage is dropped by means of a voltage drop power supply circuit mounted on a semiconductor integrated circuit devices and by which a dropped voltage is applied to internal circuits of the devices. A decrease in the power supply voltage to be applied to the internal circuits increases the resistance of the MOS transistors to the hot carriers.

A conventional voltage drop power supply circuit can be classified into:

(1) a flat voltage characteristic type circuit in which the output voltage (i.e. the voltage after the voltage drop) does not change when the external power supply voltage changes, or (2) an external voltage dependent type circuit in which the dropped voltage depends on the external power supply voltage.

The voltage drop power supply circuit of the flat voltage characteristic type (1) is capable of stably generating a constant voltage independent of variations in the external power supply voltage. Hence, the voltage drop power supply circuit of the flat voltage characteristic type is frequently employed, as compared to the voltage drop power supply circuit of the above type (2).

A voltage acceleration test (burn-in test) is known as one of methods for testing semiconductor integrated circuit devices. In the voltage acceleration test, a high voltage (acceleration or burn-in voltage) outside a normal operation voltage range for internal circuits of the semiconductor integrated circuit devices is applied to the internal circuits for a predetermined period. The application of the high voltage does not affect normal transistors of the semiconductor integrated circuit devices. However, deterioration of defective transistors is accelerated by the application of the high voltage. Semiconductor integrated circuit devices having defective transistors which have deteriorated by the application of the high voltage for the predetermined period are discarded. However, even when the external power supply voltage is increased in order to perform the voltage acceleration test, the output voltage after the voltage drop does not reach the operation voltage necessary for the voltage acceleration test in the semiconductor integrated circuit devices having the voltage drop power supply circuits of the flat voltage characteristic type, and hence the voltage acceleration test cannot be substantially performed. Hence, it is required that the voltage acceleration test can be carried out for the semiconductor integrated circuit devices having the voltage drop power supply circuits of the flat voltage characteristic type.

FIG. 1 is a block diagram of a conventional voltage drop power supply circuit provided in a semiconductor integrated circuit device. Referring to FIG. 1, a constant internal voltage supply unit 1, a burn-in voltage (acceleration voltage) supply unit 2, and a regulator unit 3 are formed in a semiconductor integrated circuit device. An external power supply voltage Vcc is applied to the units 1, 2 and 3. The regulator unit 3 outputs an operation voltage (after the voltage drop) to internal circuits of the semiconductor integrated circuit device.

When the external power supply voltage Vcc is within a normal operation voltage range, the constant internal voltage supply unit 1 generates a predetermined constant internal power supply voltage V1, and the burn-in voltage supply unit 2 generates a burn-in voltage V2 lower than the constant internal power supply voltage V1. Hence, the constant voltage V1 is applied to the regulator unit 3, which generates a constant operation voltage V.

When the external power supply voltage Vcc exceeds the normal operation voltage range, the constant voltage V1 is continuously output by the constant internal voltage supply unit 1, while the burn-in voltage V2 proportional to the external power supply voltage Vcc is generated by the burn-in voltage supply unit 2. Since V2>V1, the burn-in voltage V2 is applied to the regulator unit 3. The regulator unit 2 outputs the voltage V dependent on the input voltage V2. In the above manner, when the external power supply voltage Vcc increases and becomes out of the normal operation voltage range, the burn-in voltage V2 proportional to the external power supply voltage Vcc is generated by the burn-in voltage supply unit 2, and the internal power supply voltage, which is generated by the regulator unit 3 and is higher than the normal operation voltage necessary for the transistors, is applied to the internal circuits. Hence, the voltage acceleration test (burn-in test) can be performed.

It is known that dropped voltage (internal power supply voltage) vs. external power supply voltage characteristics shown in FIGS. 2 through 4 depend on the structure of the burn-in voltage supply unit 2. In the voltage characteristics shown in FIGS. 2 through 4, the internal power supply voltage increases in proportion to the external power supply voltage Vcc until the external power supply voltage Vcc reaches a voltage Vcc1. The internal power supply voltage is then maintained at a constant value within an operation voltage range between Vcc1 and Vcc2.

As shown in FIG. 2, the internal power supply voltage changes along a straight line I connecting the origin O and the internal power supply voltage corresponding to the voltage Vcc2 when the burn-in test, in which the external power supply voltage Vcc is increased to a level higher than the voltage Vcc2, is carried out for a semiconductor integrated circuit device having the burn-in voltage supply unit 2 having the voltage characteristics shown in FIG. 2. As shown in FIG. 3, the internal power supply voltage changes along a straight line II parallel to a straight line connecting the origin O and the internal power supply voltage corresponding to the voltage Vcc1 when the burn-in test is carried out for a semiconductor integrated circuit device having the burn-in voltage supply unit 2 having the voltage characteristics shown in FIG. 2. The internal power supply voltage changes along a straight line III (FIG. 4) connecting the origin O and the internal power supply voltage corresponding to the voltage Vcc2. In this case, the internal power supply voltage is equal to the external power supply voltage.

Normally, semiconductor integrated circuit devices include transistors to which the external power supply voltage is applied, and transistors to which an internal power supply voltage generated by a voltage drop power supply circuit is applied. The conventional voltage acceleration test for such semiconductor integrated circuit devices is carried out so that the voltage application condition set during the test does not match the voltage application condition set during the normal operation. For example, the ratio of the internal power supply voltage to the external power supply voltage used during the normal operation is not equal to that used during the voltage acceleration test. In this case, one of the two types of transistors deteriorates faster than the other type of transistors, and a calculation procedure for obtaining the ratios becomes complex and troublesome. As a result, it is very difficult to complete the voltage acceleration test in a short time.

More particularly, the conventional voltage acceleration test cannot be performed at a ratio of the internal power supply voltage to the external power supply voltage (Vcc1-Vcc2) not equal to that set during the normal operation (in the case shown in FIG. 3). Even when the same ratio can be set, the voltage acceleration test can be performed with respect to only a limited part of the normal operation voltage range. In the voltage characteristic shown in FIG. 2, the voltage acceleration test can be performed at the same ratio as the normal operation in which the external power supply voltage Vcc is equal to Vcc2. It will be noted that the voltage Vcc2 is the upper limit of the normal operation voltage range. In the voltage characteristic shown in FIG. 4, the voltage acceleration test can be performed at the same ratio as the normal operation in which the external power supply voltage Vcc is equal to Vcc1. It will be noted that the voltage Vcc1 is the lower limit of the normal operation voltage range. Hence, the reliability of the acceleration test is not good.

SUMMARY OF THE INVENTION

It is a general object of the present invention to provide a method for testing a semiconductor integrated circuit device and a voltage drop power supply circuit suitable for the method.

A more specific object of the present invention is to provide a method for testing a semiconductor integrated circuit device and a voltage drop power supply circuit in which the relationship between the internal power supply voltage and the external power supply voltage matches the relationship between the internal power supply voltage and the external power supply voltage within a wide voltage range, so that the semiconductor integrated circuit device can be correctly tested in a short time.

The above objects of the present invention are achieved by a method of testing a semiconductor integrated circuit device in which internal circuits of the semiconductor integrated circuit device are supplied, in a normal operation, with a constant internal power supply voltage generated from an external power supply voltage in accordance with a first characteristic line defining a relationship between the external power supply voltage and the internal power supply voltage. The above method comprises the steps of: generating a burn-in voltage from the external power supply voltage having a level higher than that used in the normal operation in accordance with a second characteristic line defining a relationship between the external power supply voltage and the internal power supply line, the second characteristic line crossing the first characteristic line at an intermediate point between lower and upper limit voltages defined by the first characteristic line, the burn-in voltage being greater than the internal power supply voltage used in the normal operation; and applying the burn-in voltage to the internal circuits of the semiconductor integrated circuit device.

The above objects of the present invention are also achieved by a voltage drop power supply circuit for a semiconductor integrated circuit device comprising: first means for generating a constant internal power supply voltage from an external power supply voltage in accordance with a first characteristic line defining a relationship between the external power supply voltage and the internal power supply voltage and for applying the constant internal power supply voltage to internal circuits of the semiconductor integrated circuit device; and second means for generating a burn-in voltage from the external power supply voltage having a level higher than that used in the normal operation in accordance with a second characteristic line defining a relationship between the external power supply voltage and the internal power supply line and for applying the burn-in voltage to the internal circuits when a burn-in test is carried out for the semiconductor integrated circuit device. The second characteristic line crosses the first characteristic line at an intermediate point between lower and upper limit voltages defined by the first characteristic line. The burn-in voltage is greater than the internal power supply voltage used in the normal operation.

Another object of the present invention is to provide a semiconductor integrated circuit device having the above-mentioned voltage drop power supply circuit.

This object of the present invention is achieved by a semiconductor integrated circuit device comprising: first internal circuits operating with an external power supply voltage; second internal circuits operating with a constant internal power supply voltage obtained by dropping the external power supply voltage; first means for generating the constant internal power supply voltage from the external power supply voltage in accordance with a first characteristic line defining a relationship between the external power supply voltage and the internal power supply voltage and for applying the constant internal power supply voltage to the second internal circuits of the semiconductor integrated circuit device; and second means for generating a burn-in voltage from the external power supply voltage having a level higher than that used in the normal operation in accordance with a second characteristic line defining a relationship between the external power supply voltage and the internal power supply line and for applying the burn-in voltage to the second internal circuits when a burn-in test is carried out for the semiconductor integrated circuit device. The second characteristic line crosses the first characteristic line at an intermediate point between lower and upper limit voltages defined by the first characteristic line. The burn-in voltage is greater than the internal power supply voltage used in the normal operation.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
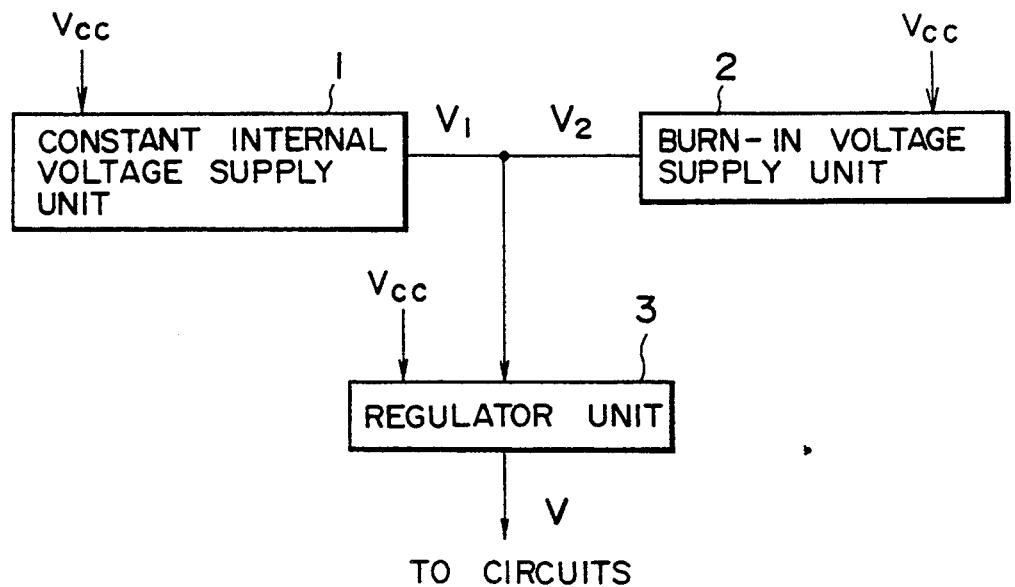
FIG. 1 is a block diagram of a conventional voltage drop power supply circuit.
Figure 2:
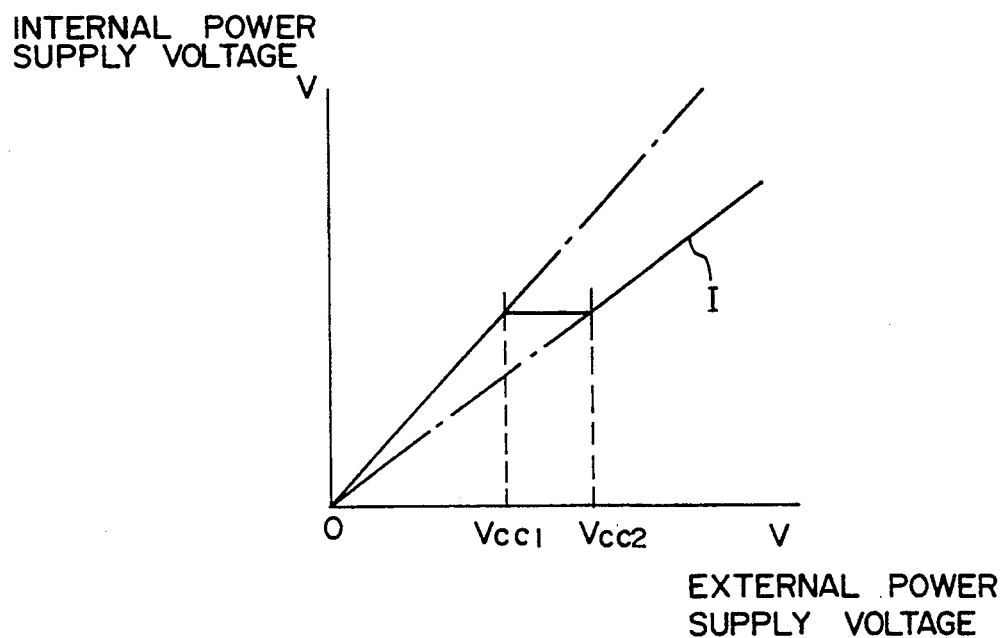
FIGS. 2, 3 and 4 are graphs showing voltage characteristics depending on the structure of the voltage drop power supply circuit.
Figure 3:
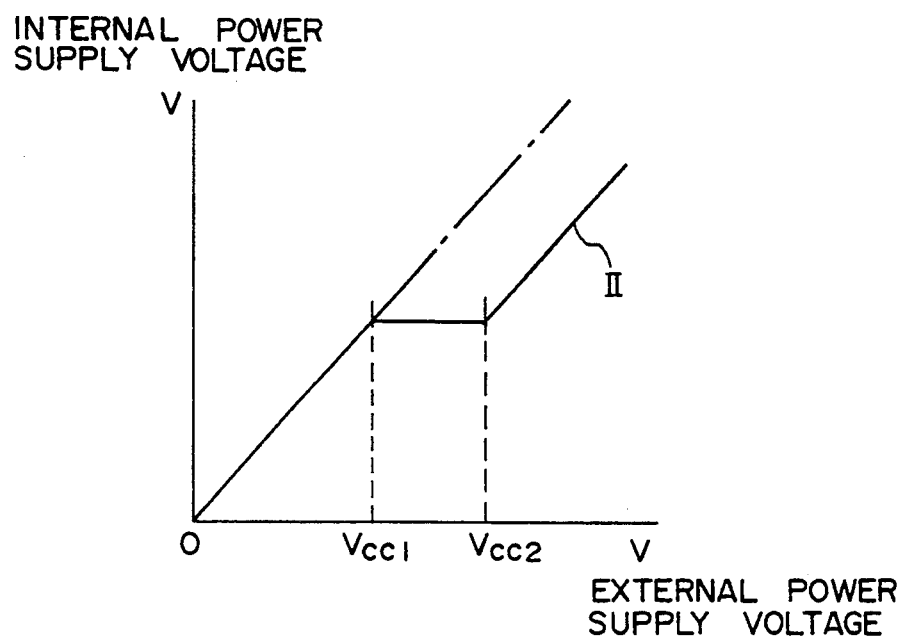
Figure 4:
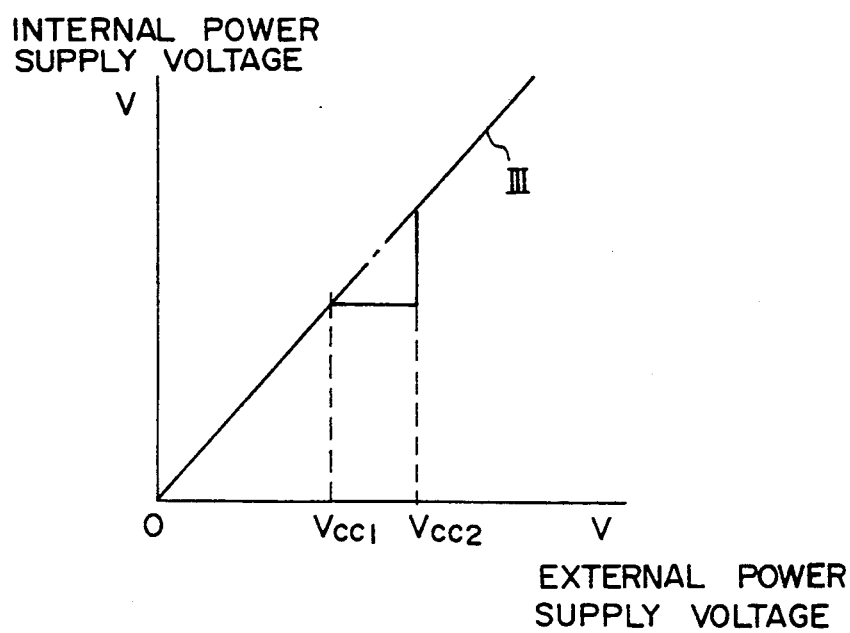
Figure 5:
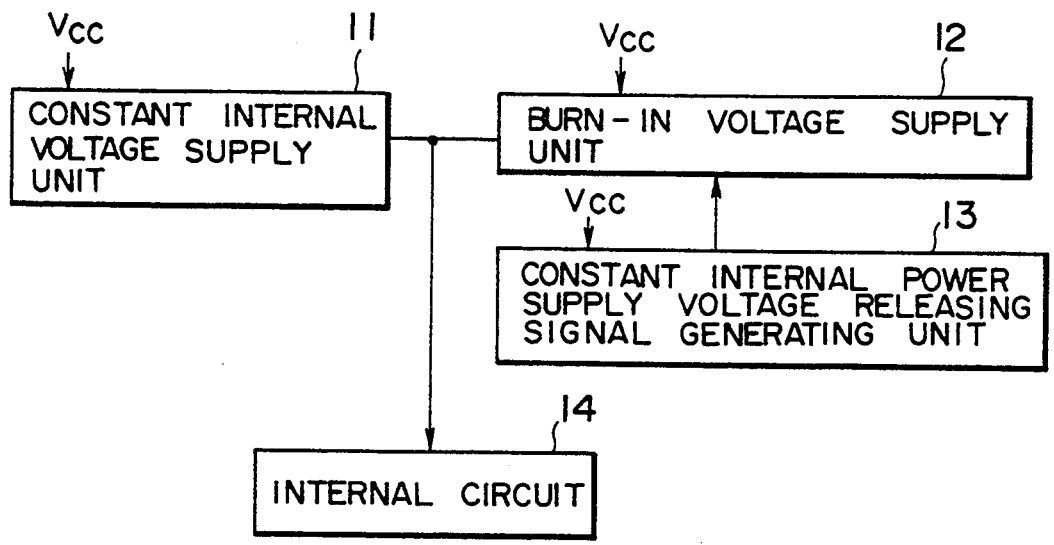
FIG. 5 is a block diagram illustrating an overview of the present invention.

Referring to FIG. 5, a voltage drop power supply circuit of the present invention includes a constant internal voltage supply unit 11, and a burn-in (acceleration voltage) voltage supply unit 12. In actuality, a constant internal power supply voltage releasing signal generating unit 13 is used.

Figure 6:
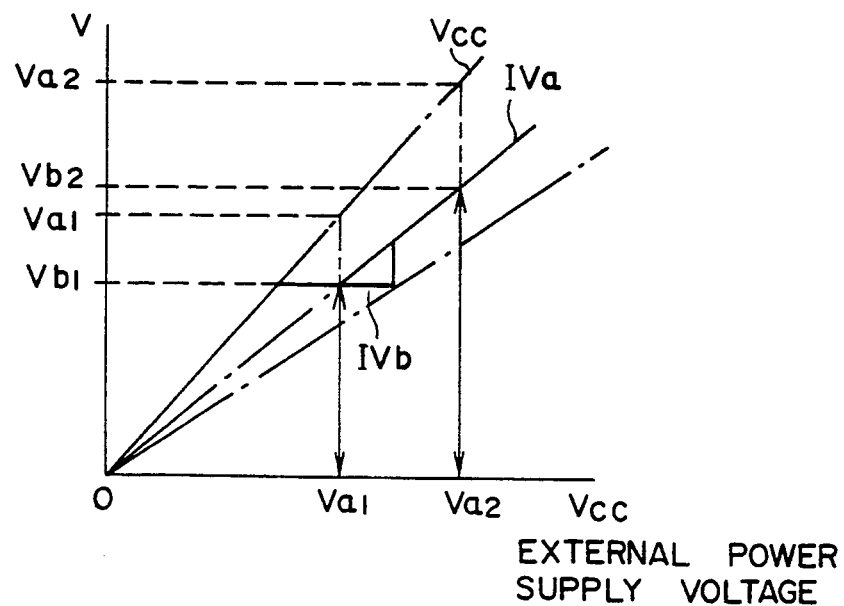
FIG. 6 is a graph showing a voltage characteristic of the structure shown in FIG. 5.

Referring to FIG. 6, the constant internal voltage supply unit 11 generates a constant internal power supply voltage (after the voltage drop) Vb1 from an external power voltage Vcc by dropping the voltage Vcc. The constant internal power supply voltage is applied to an internal circuit 14 of a semiconductor integrated circuit device. The burn-in voltage supply unit 12 generates, in accordance with a first characteristic line IVa, a burn-in voltage (acceleration voltage) Vb2 from the external power supply voltage Vcc having a level Va2 higher than a level Va1 used for the normal operation. The burn-in voltage Vb2 is higher than the constant internal power supply voltage Vb1 generated by the constant internal voltage supply unit 11. The first characteristic line IVa, which is related to the test operation, shows the relationship between the external power supply voltage (input voltage) Vcc and the internal power supply voltage (output voltage). The first characteristic line IVa is designed so that it crosses a second characteristic line IVb showing the constant internal power supply voltage Vb1 at an intermediate point between the lower and upper limits of the second characteristic line IVb (the normal operation voltage range).

During the test operation, the burn-in voltage can be generated so that the ratio (Vb1/Va1) of the constant internal power supply voltage Vb1 to the external power supply voltage Va1 used in the normal operation is equal to the ratio (Vb2/Va2) of the burn-in voltage Vb2 to the external power supply voltage Va2. The external supply voltage Va1 is located at approximately the center of the normal operation range. The voltage acceleration test can be performed at the same ratio as that for the normal operation using the voltage Va1. It is possible to arbitrarily locate the cross point of the lines IVa and IVb within the normal voltage operation range.

As will be described later, it is also possible to match the relationship between the external power supply voltage and the internal power supply voltage used during the normal operation with that used during the burn-in test by determining a characteristic line parallel to a VCC line connecting the origin and the lower limit of the normal operation voltage range so that the above characteristic line crosses the characteristic line IVb at an intermediate point thereof.

Until the external power supply voltage Vcc becomes equal to the upper limit of the normal operation voltage range, the constant internal voltage generated by the constant internal voltage supply unit 11 is supplied to the internal circuit 14. In the burn-in test in which the external power supply voltage Vcc is made to be higher than the upper limit, the constant internal power supply voltage releasing signal generating unit 13 outputs a release signal to the burn-in voltage supply unit 12. In response to the releasing signal, the burn-in voltage supply unit 12 generates the burn-in voltage according to the characteristic line IVa.

Figure 7:
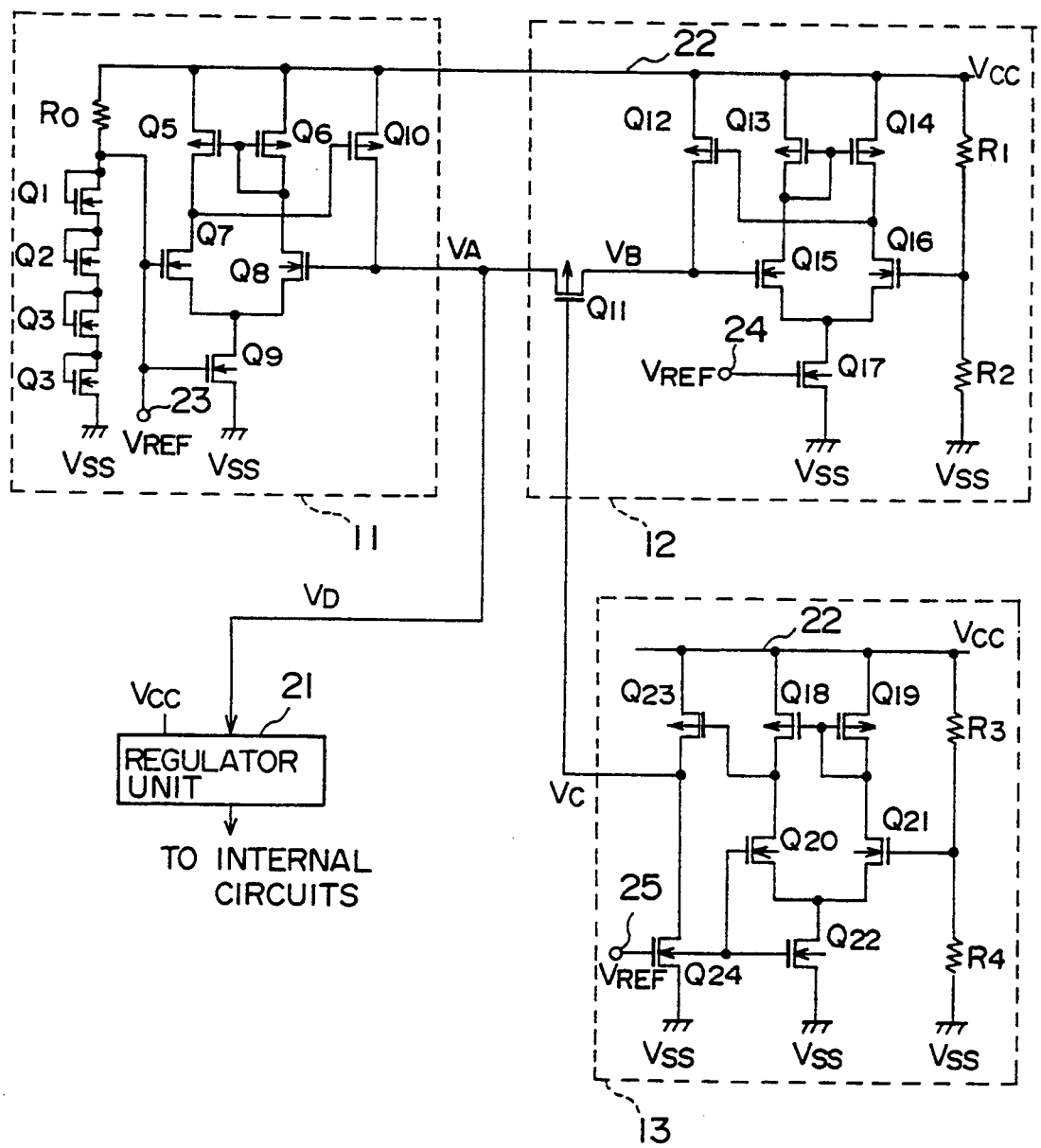
FIG. 7 is a circuit diagram of a first embodiment of the present invention.

FIG. 7 is a circuit diagram of the voltage drop power supply circuit according to the first embodiment of the present invention. In FIG. 7, parts that are the same as parts shown in FIG. 5 are given the same reference numbers. A regulator unit 21 generates a voltage dependent on an input voltage VD (equal to a voltage VA described later), and distributes it to internal circuits of a semiconductor integrated circuit device having the voltage drop power supply circuit.

The constant internal voltage supply unit 11 is made up of a resistor R0, diode-connected N-channel MOS transistors Q1–Q4, P-channel MOS transistors Q5, Q6 and Q10, and N-channel MOS transistors Q7–Q9. The P-channel MOS transistors Q5 and Q6 form a current-mirror circuit. The resistor R0 and the transistors Q1–Q4 form a series circuit connected between an external power supply voltage Vcc line 22 and ground. The resistor R0, and the drain and gate of the transistor Q1 are connected to a terminal 23, and to the gates of the transistors Q7 and Q9.

The drains of the transistors Q5 and Q6 are connected to the drains of the transistors Q7 and Q8, respectively. The sources of the transistors Q7 and Q8 are connected to the drain of the transistor Q9. The gate of the transistor Q10 is connected to the drains of the transistors Q5 and Q7, and the drain of the transistor Q10 is connected to the gate of the transistor Q8.

The burn-in voltage supply unit 12 is made up of a P-channel MOS transistor Q11 for switching, P-channel MOS transistors Q12, Q13 and Q14, resistors R1 and R2, and N-channel MOS transistors Q15, Q16 and Q17. The sources of the transistors Q12–Q14 are connected to the external power supply voltage line 22. The gate of the transistor Q15 is connected to the drain of the transistor Q12 and to the source of the transistor Q11, and to the drain of the transistor Q15 is connected to the drain and gate of the transistor Q13. The drain of the transistor Q16 is connected to the gate of the transistor Q12 and the drain of the transistor Q14, and the gate of the transistor Q16 is connected to a connection node at which the resistors R1 and R2 are connected in series. The drain of the transistor Q17 is connected to the sources of the transistors Q15 and Q16.

The transistor Q13 and Q14 form a current-mirror circuit. The transistor Q17 receives an output reference voltage $V_{REF}$ applied to the gate via a terminal 24, and functions as a constant-current source. The resistors R1 and R2 form a voltage dividing circuit.

The constant internal voltage releasing signal generating unit 13 is made up of resistors R3 and R4, P-channel MOS transistors Q18, Q19 and Q23, and N-channel MOS transistors Q20–Q22 and Q24. The resistors R3 and R4 form a voltage dividing circuit, which divides the external power supply voltage Vcc. The sources of the transistors Q18, Q19 and Q23 are connected to the external power supply voltage line 22. The sources of the transistors Q20 and Q21 are connected to each other. The drain of the transistor Q22 is connected to the sources of the transistors Q20 and Q21. The gate of the transistor Q24 is connected to the gates of the transistors Q20 and Q22, and to a terminal 25.

The transistors Q18 and Q19 connected to the drains of the transistors Q20 and Q21 form a current-mirror circuit. The gate of the transistor Q21 is connected to a connection node at which the resistors R3 and R4 are connected in series. The gate of the transistor Q23 is connected to the drains of the transistors Q18 and Q20. The drains of the transistors Q23 and Q24 are connected to the gate of the transistor Q11.

A description will now be given, with reference to FIGS. 8A through 8D, of the operation of the first embodiment of the present invention. When the external power supply voltage Vcc is less than the threshold voltages of the transistors Q1–Q4, the transistors Q1–Q4 are OFF, and a voltage the same as the external power supply voltage Vcc is output to the terminal 23 as the reference voltage $V_{REF}$. At this time, the gate potential of the transistor Q8 balances with that of the transistor Q7, and these gate potentials are equal to the external power supply voltage Vcc.

When the external power supply voltage Vcc becomes equal to or higher than a level corresponding to the threshold voltages of the transistors Q1–Q4, the transistors Q1–Q4 are turned ON, and the constant reference voltage $V_{REF}$ is output to the terminal 23. The reference voltage $V_{REF}$ is applied to the gate of the transistor Q9, which outputs a constant current. The reference voltage $V_{REF}$ is also applied to the gate of the transistor Q7. The drain of the transistor Q7 is connected to the current-mirror circuit including the transistors Q5 and Q6. Hence, a drain current the same as the drain current of the transistor Q7 flows in the transistor Q8, and the gate potential of the transistor Q8 is balanced at a potential equal to the gate potential $V_{REF}$ of the transistor Q7. Hence, as shown by the solid line in FIG. 8A, the gate voltage VA of the transistor Q8 is the constant internal power supply voltage when the external power supply voltage is equal to or higher than the gate potential $V_{REF}$.

A voltage obtained by dividing the external power supply voltage Vcc by means of the resistors R1 and R2 is applied to the gate of the transistor Q16. The gate of the transistor Q17 connected to the source of the transistor Q16 receives the reference voltage $V_{REF}$ via the terminal 24, and the transistor Q17 functions as a constant-current source.

As the gate potential of the transistor Q16 increases, the drain current of the transistor Q16 increases, and the drain current of the transistor Q12 decreases. Further, the gate potential of the transistor Q15 increases. When the gate potential of the transistor Q15 becomes equal to the gate potential of the transistor Q16, the transistor Q12 is turned OFF. Then, identical currents flow in the transistors Q15 and Q16 from the current-mirror circuit including the transistors Q13 and Q14 connected to the drains of the transistors Q15 and Q16, respectively. In this state, the transistors Q15 and Q16 are balanced with respect to each other.

Figure 8A:
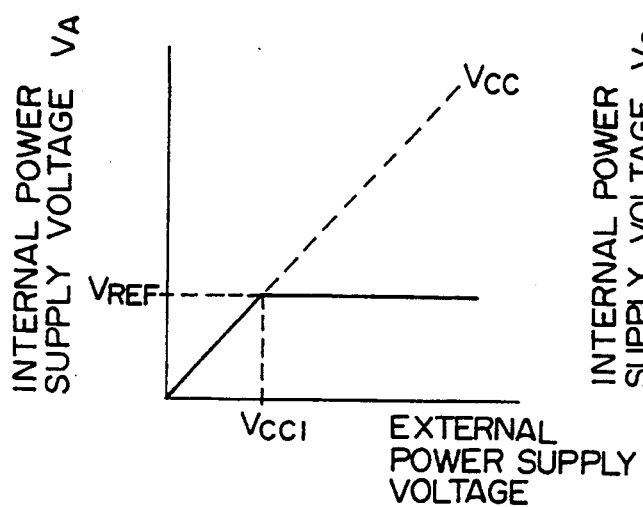
FIGS. 8A, 8B, 8C and 8D are graphs illustrating the operations of structural parts of the first embodiment of the present invention shown in FIG. 7.
Figure 8C:
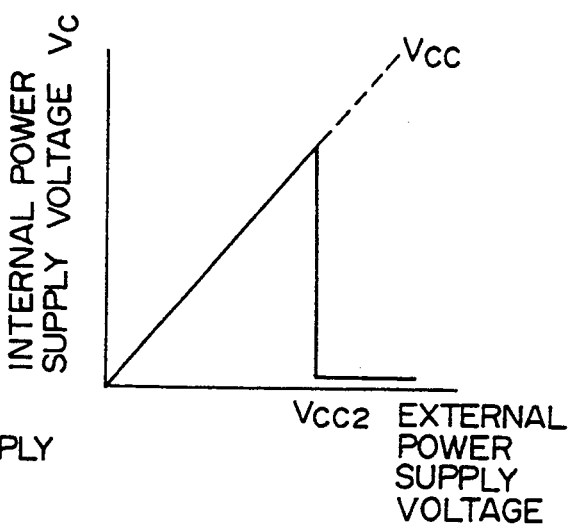
Figure 8B:
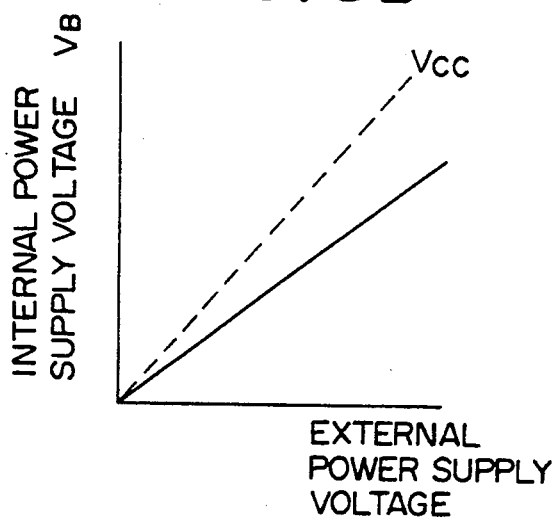

Hence, as shown in FIG. 8B, the gate voltage VB of the transistor Q15 is equal to the divided voltage applied to the gate of the transistor Q16 and derived from the external power supply voltage Vcc by means of the resistors R1 and R2. Further, the gate voltage VB of the transistor Q15 is less than the external power supply voltage Vcc and changes in proportion to change in the external power supply voltage Vcc. The voltage VB obtained at the gate of the transistor Q15 is output to the source of the transistor Q11 as the burn-in voltage.

The reference voltage $V_{REF}$ is applied, via the terminal 25, to the gates of the transistors Q20 and Q22 of the constant internal power supply voltage releasing signal generating unit 23, and the transistor Q23 functions as a constant-current source. A voltage obtained by dividing the external power supply voltage Vcc by means of the resistors R3 and R4 is applied to the gate of the transistor Q21. The ratio of the resistances of the resistors R3 and R4 is set to a predetermined value greater than the ratio of the resistances of the resistors R1 and R2. Hence, the gate voltage of the transistor Q21 changes along a characteristic line having a slope less than the solid line shown in FIG. 8B.

The current-mirror circuit including the transistors Q18 and Q19 connected to the transistors Q20 and Q21 outputs the same drain currents in the transistors Q20 and Q21. When the gate voltage of the transistor Q21 is less than the reference voltage $V_{REF}$ applied to the gate of the transistor Q20, the currents flowing in the transistors Q18 and Q19 are small. At this time, the transistor Q23 is ON, and the voltage Vc of the connection node at which the drains of the transistors Q23 and Q24 are connected to each other is approximately equal to the external power supply voltage Vcc.

When the external power supply voltage Vcc reaches the level Vcc2, and the gate voltage of the transistor Q21 defined by dividing the external power supply voltage Vcc by means of the resistors R3 and R4 becomes equal to the gate voltage $V_{REF}$ of the transistor Q20, a current half of the drain current of the transistor Q22 flows in each of the transistors Q20 and Q21, and therefore the transistor Q23 is turned OFF. Hence, the above voltage Vc becomes equal to a Vss (ground level), which is the source potential of the transistor Q24.

When the external power supply voltage Vcc is higher than the level Vcc2, the transistor Q23 is turned OFF in the same manner as mentioned above, and the voltage Vc becomes equal to the ground level Vss. Hence, the voltage Vc changes according to a characteristic line indicated by the solid line shown in FIG. 8C. The levels Vcc1 and Vcc2 denote the lower and upper limit values of the normal operation voltage range of the semiconductor integrated circuit device to be tested.

The voltage Vc is applied to the transistor Q11, which turns ON and OFF in response to the voltage Vc. When the external power supply voltage Vcc is equal to or higher than the level Vcc2, the low-level voltage Vc is applied to the gate of the transistor Q11 as a constant internal power supply voltage releasing signal. In response to the low-level releasing signal, the transistor Q11 is turned ON. When the external power supply voltage Vcc is less than the level Vcc2, the voltage Vc is at a high level approximately equal to Vcc, and the transistor Q11 is turned OFF.

When the external power supply voltage Vcc is less than the level Vcc2, the transistor Q11 is OFF, and the constant internal power supply voltage VA generated by the internal constant voltage supply unit 11 is output to the regulator unit 21. When the external power supply voltage Vcc is equal to or higher than the level Vcc2, the transistor Q11 is ON and the burn-in voltage VB output by the burn-in voltage supply unit 12 is greater than the voltage VA. Hence, the burn-in voltage VB output by the burn-in voltage supply unit 12 is output to the regulator unit 21 via the transistor Q11.

Figure 8D:
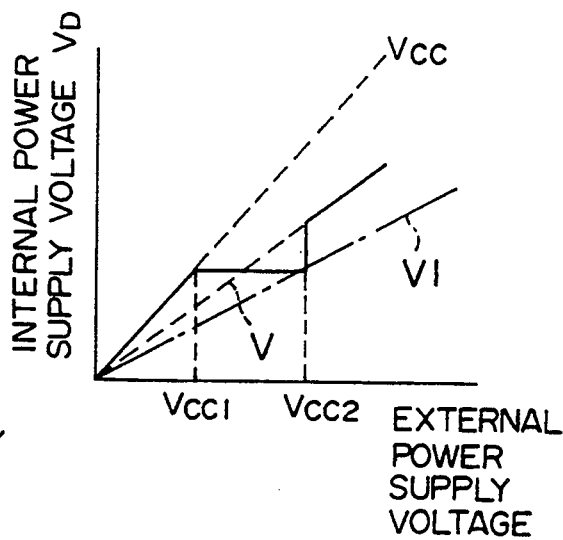

Hence, an input internal power supply voltage VD of the regulator unit 21 changes in response to the external power supply voltage Vcc according to a characteristic indicated by the solid line shown in FIG. 8D. It can be seen from FIG. 8D that the burn-in voltage is defined by a straight line V connecting the origin and an intermediate point between the normal operation voltage range between Vcc1 and Vcc2. Hence, in the voltage acceleration (burn-in) test, the internal power supply voltage VD output by the regulator unit 14 can be applied to the internal circuits with the same ratio VD/Vcc as that for the normal operation.

Figure 9:
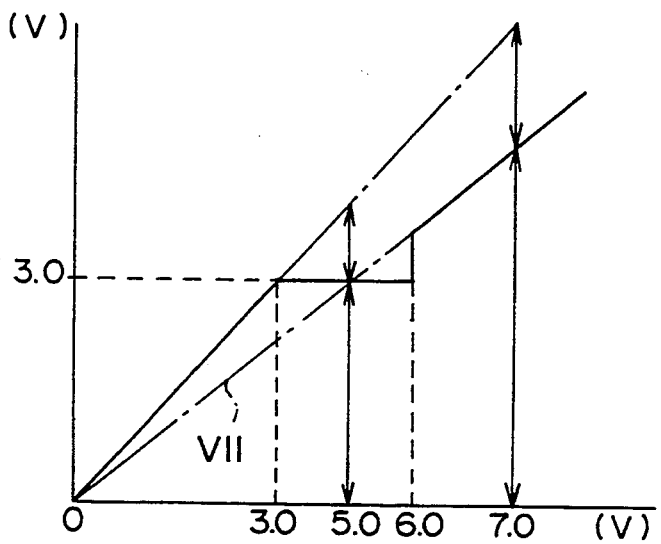
FIG. 9 is a graph illustrating a voltage characteristic of the circuit shown in FIG. 7.

FIG. 9 is a graph of an example of the internal power supply voltage vs. the external power supply voltage characteristics. The semiconductor integrated circuit device normally operates within a range between 3.0 (V) and 6.0 (V), and internal circuits thereof receive a constant internal power supply voltage of 3.0 (V). A straight line VII connects the origin O and a point corresponding to an external power supply voltage of 5.0 (V). In the burn-in test, an external power supply voltage Vcc equal to or higher than 6.0 (V) is applied to the device, and the burn-in voltage defined by the straight line VII is generated and applied to the internal circuits.

Figure 10:
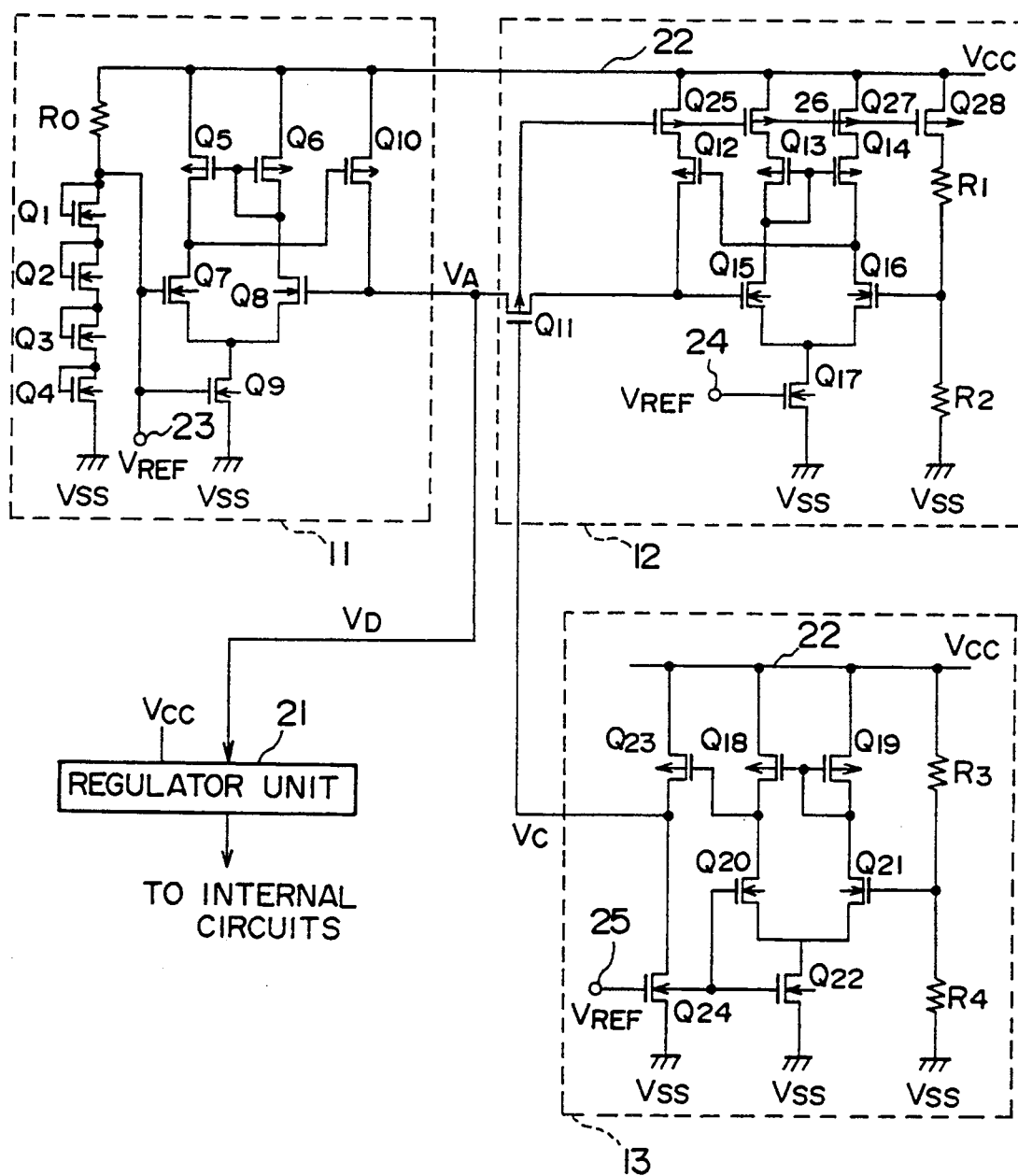
FIG. 10 is a circuit diagram of a second embodiment of the present invention.

FIG. 10 is a circuit diagram of a voltage drop power supply circuit according to a second embodiment of the present invention. In FIG. 10, parts that are the same as parts shown in FIG. 7 are given the same reference numbers. The second embodiment of the present invention differs from the first embodiment thereof in that P-channel MOS transistors Q25–Q28 used for switching are provided in the burn-in voltage power supply unit 12.

Referring to FIG. 10, the sources of the transistors Q25, Q26, Q27 and Q28 are connected to the Vcc line 22, and the gates thereof are connected to the gate of the transistor Q11 and to the drains of the transistors Q23 and Q24. The drains of the transistors Q25 and Q26 are connected to the sources of the transistors Q12, Q13 and Q14. The drain of the transistor Q28 is connected to one end of the resistor R1.

When the external power supply voltage Vcc is within the normal operation voltage range, that is, the Vcc is less than Vcc2, the output voltage Vc of the constant internal power supply voltage releasing signal generating unit 13 is maintained at the high level, and the transistors S25–Q28 are OFF in the same manner as the transistor Q11.

When the burn-in test is carried out, that is, when the external power supply voltage Vcc is equal to or higher than Vcc2, the voltage Vc is switched to the low level, and hence the transistors Q25–Q28 are turned ON at the same time as the transistor Q11. Hence, the external power supply voltage Vcc is prevented from being applied to the burn-in voltage power supply unit 12 in the normal operation, and is allowed to be applied thereto in the burn-in test. During the burn-in test, the external power supply voltage Vcc is applied to the sources of the transistors Q12–Q14 as well as the voltage dividing circuit including the resistors R1 and R2 via the sources and drains of the transistors Q25–Q28, respectively. Then, the burn-in voltage supply unit 12 operates in the same manner as described previously.

According to the second embodiment of the present invention, the burn-in voltage supply unit 12 is activated only when the burn-in test is performed. There is no problem even when the burn-in voltage supply unit 12 is maintained in the disabled state during the normal operation of the semiconductor integrated circuit device. Hence, the quantity of power consumed during the normal operation can be reduced.

In the first and second embodiments of the present invention, the slope of the characteristic line V shown in FIG. 8D can be controlled by adjusting the ratio of the resistances of the resistors R1 and R2, and the slope of the characteristic line VI shown in FIG. 8D can be controlled by adjusting the ratio of the resistances of the resistors R3 and R4. It is possible to independently adjust the above-mentioned ratios and independently select the burn-in voltage and the constant internal power supply voltage releasing signal.

A description will now be given of a third embodiment of the present invention. The first and second embodiments of the present invention are intended to reduce the time necessary for the burn-in test and increase the reliability of the burn-in test by making the ratio of the internal power supply voltage to the external power supply voltage used for the burn-in test be equal to that used for the normal operation.

On the other hand, according to the third embodiment of the present invention, a straight line VIII connecting the origin O and the point corresponding to the lower limit voltage Vcc1 slides parallel thereto, so that a straight line IX obtained by the above parallel sliding crosses the constant internal power supply voltage line parallel to the horizontal axis at an intermediate point between Vcc1 and Vcc2. The difference delta-1 between the external power supply voltage Vcc and the corresponding burn-in voltage used for the burn-in test is equal to the difference delta-1 between the external power supply voltage Vcc and the corresponding internal power supply voltage used for the normal operation.

Now, the burn-in test is defined as follows. It will now be assumed that the external power supply voltage Vcc in the normal operation is equal to Vcc3 and is equal to Vcc4 in the burn-in test. An acceleration coefficient corresponding to internal circuits to which the external power supply voltage Vcc is to be applied is written as follows:

$$EXP((Vcc4-Vcc3)\cdot \alpha)$$

and an acceleration coefficient corresponding to internal circuits to which the internal power supply voltage is to be applied is written as follows:

$$EXP((Vcc4-delta-(Vcc3-delta))\cdot \beta$$
$$=EXP((Vcc4-Vcc3)\cdot \beta)$$

where delta=delta-1=delta-2. When $\alpha=\beta$, the above two acceleration coefficients are equal to each other. Hence, by making delta-1 and delta-2 equal to each other, it is possible to perform the burn-in test in which the condition is exponentially changed in accordance with the external power supply voltage Vcc in the same condition as the normal operation.

Figure 12:
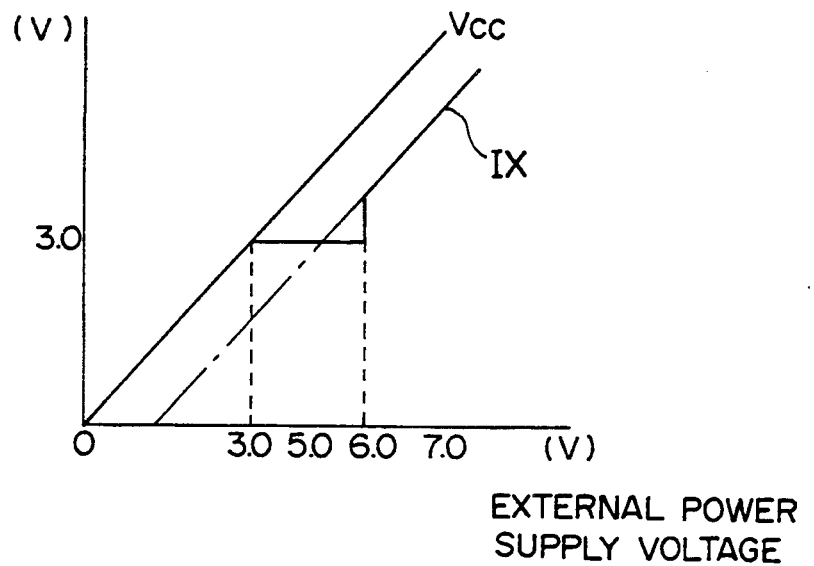
FIG. 12 is a graph illustrating an example of the voltage characteristic of the third embodiment of the present invention.

FIG. 12 is a graph of an example of the internal power supply voltage vs. external power supply voltage characteristics according to the third embodiment of the present invention. The semiconductor integrated circuit device normally operates within the normal operation voltage range between 3.0 (V) and 6.0 (V), and the corresponding internal power supply voltage is applied to internal circuits. The burn-in voltage used for the burn-in test is defined by the characteristic line IX crossing the 3.0 (V) internal power supply voltage characteristic line at the point corresponding to an external power supply voltage of 5.0 (V). In the burn-in test, the external power supply voltage is set equal to or higher than 6.0 (V).

Figure 13:
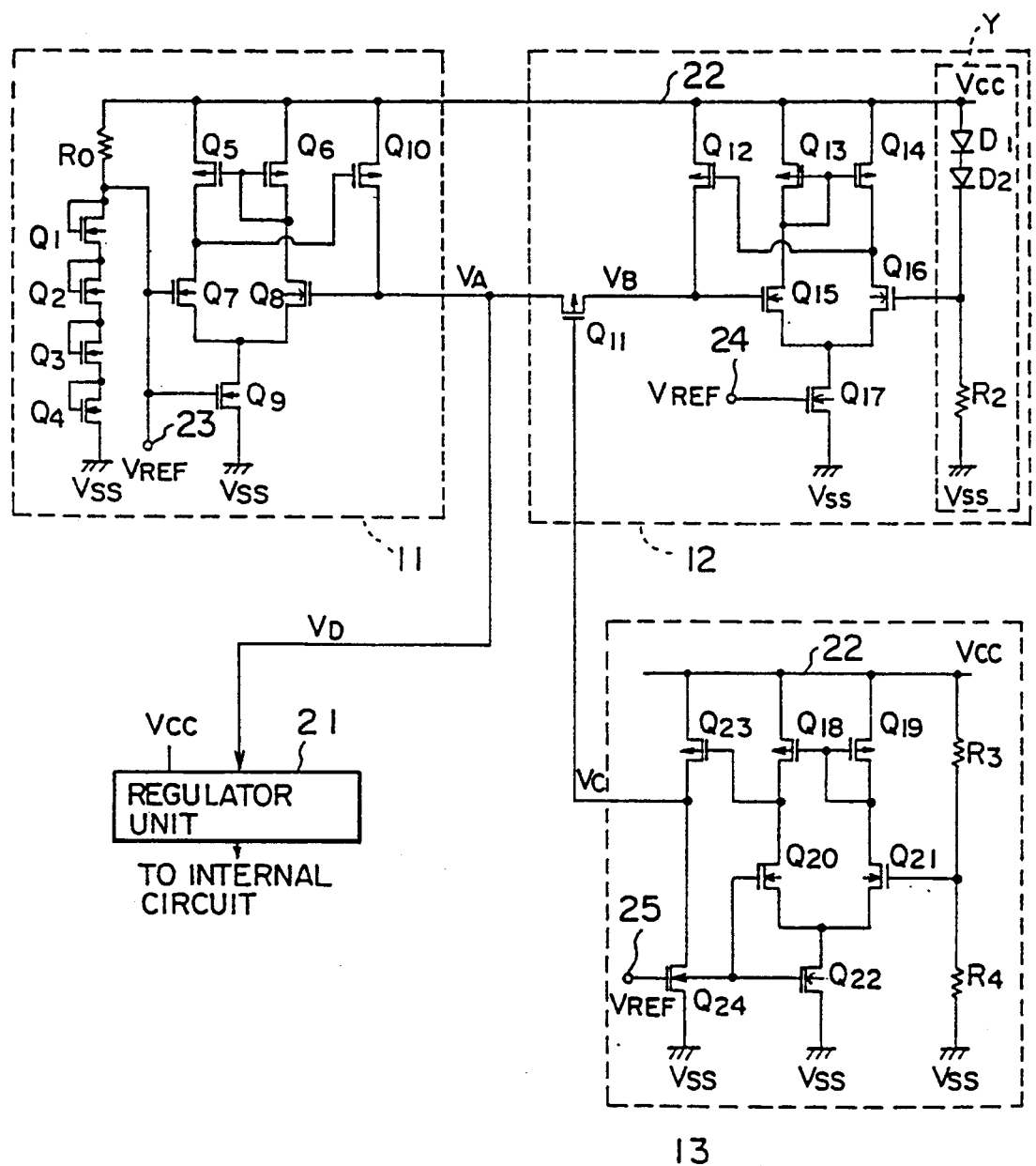
FIG. 13 is a circuit diagram of the third embodiment of the present invention.

FIG. 13 is a circuit diagram of the third embodiment of the present invention. In FIG. 13, parts that are the same as parts shown in FIG. 7 are given the same reference numbers, and description thereof will be omitted. The circuit shown in FIG. 13 has diodes D1 and D2, which are used instead of the resistor R1 provided in the burn-in voltage supply unit 12, and the resistor R2. The diodes D1 and D2 connected in series function as a level shift circuit, which provides the gate of the transistor Q16 with a dropped voltage lower than the external power supply voltage Vcc by the sum of the forward drop voltages of the diodes D1 and D2. Hence, the burn-in voltage supply unit 12 shown in FIG. 13 outputs the internal power supply voltage lower than the external power supply voltage Vcc by an amount delta.

Figure 14:
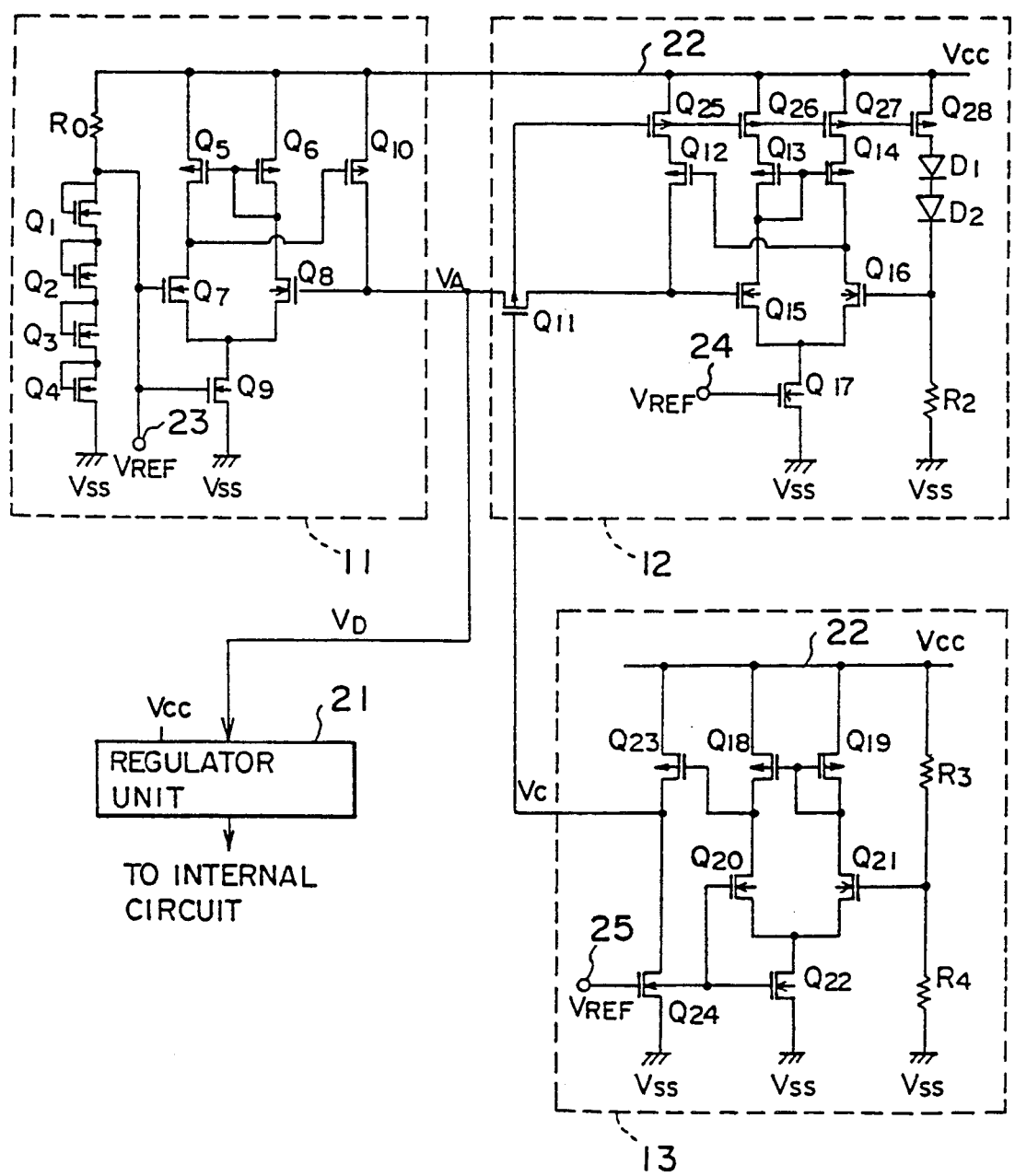
FIG. 14 is a circuit diagram of a fourth embodiment of the present invention.

FIG. 14 is a circuit diagram of a fourth embodiment of the present invention, which is configured so that the transistors Q25-Q28 used in the second embodiment of the present invention are applied to the circuit according to the third embodiment of the present invention. When the constant internal power supply voltage releasing signal switched to the low level is output by the generating unit 13, the transistors Q25-Q28 are turned ON and the burn-in voltage supply unit 12 is activated.

Figure 11:
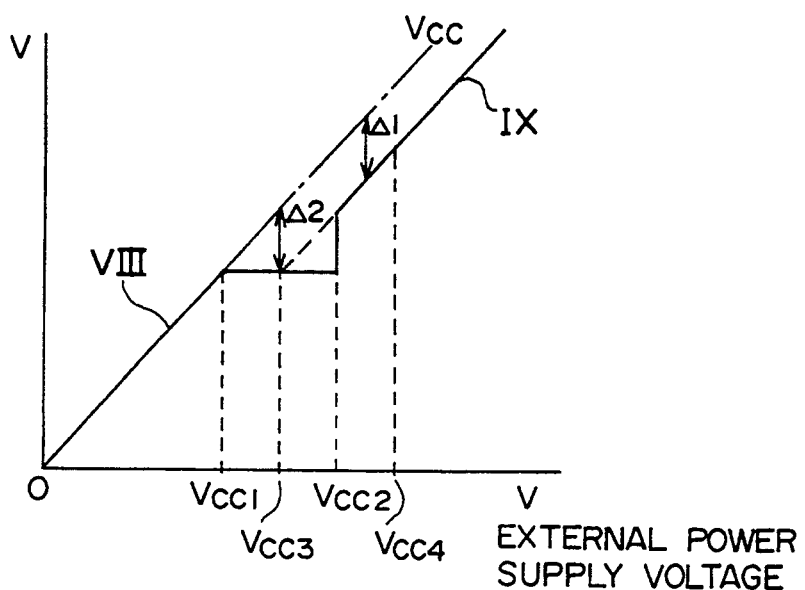
FIG. 11 is a graph illustrating a voltage characteristic of a third embodiment of the present invention.
Figure 15:
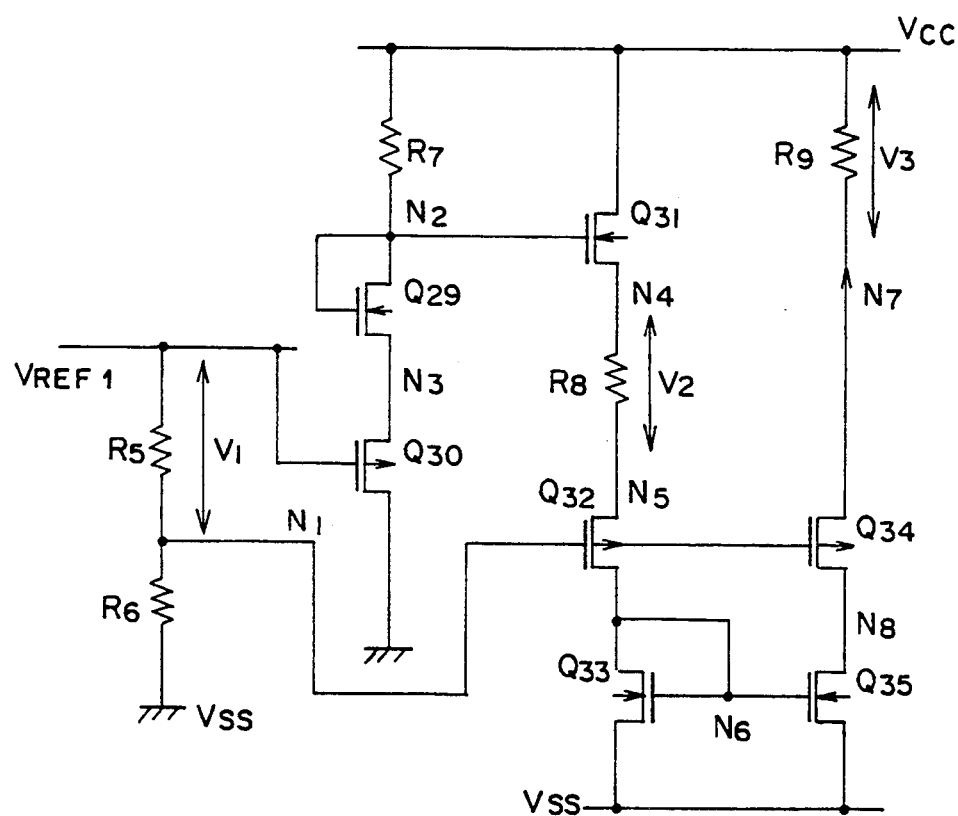
FIG. 15 is a circuit diagram of a variation of a circuit Y shown in FIG. 13.

FIG. 15 shows a circuit which can be used to replace a circuit Y shown in FIG. 13. In the third embodiment of the present invention, the characteristic line IX shown in FIGS. 11 and 12 can be adjusted stepwise because the parallel shifting of the Vcc line VIII depends on the sum of the forward drop voltages of the diodes D1 and D2. The circuit shown in FIG. 15 is capable of successively adjusting the characteristic line IX.

The circuit shown in FIG. 15 is made up of N-channel MOS transistors Q29. Q31, Q33 and Q35, P-channel MOS transistors Q30, Q32 and Q34, and resistors R5-R9. A connection node N7 at which the source of the transistor Q34 and the resistor R9 are connected is connected to the gate of the transistor Q15 shown in FIGS. 13 and 14. The resistors R1 and R6 are connected in series, and a constant voltage $V_{REF1}$ is divided by the resistors R1 and R6. The constant voltage $V_{REF1}$ is a voltage obtained by dropping the external power supply voltage Vcc, and is equal to, for example, the reference voltage $V_{REF}$ shown in FIGS. 13 and 14. The voltage VN1 of a node N1 is obtained by dividing the reference voltage $V_{REF1}$ by means of the resistors R5 and R6. The reference voltage $V_{REF1}$ is applied to the gate of the transistor Q30, the voltage VN3 of a node N3 connected to the source of the transistor Q30 is written as follows:

$$VN3=V_{REF1}+VthP$$

where VthP is a threshold voltage of the transistor Q30.

The voltage VN1 is applied to the gate of the transistor Q33, and the voltage VN5 of a node N5 connected to the source of the transistor Q32 is written as follows:

$$VN5=VN1+VthP$$

where VthP denotes the threshold voltage of the transistor Q32.

The transistors Q29 and Q31 form a current-mirror circuit, and the same currents flow in these transistors. Hence, the voltage VN3 of the node N3 connected to the source of the transistor Q29 is equal to the voltage VN4 of a node N4 connected to the source of the transistor Q31. The transistors Q33 and Q35 form a current-mirror circuit, and identical currents flow in these transistors. Hence, the voltage VN5 of the node N5 connected to the source of the transistor Q32 is equal to the voltage VN7 of a node N7 connected to the source of the transistor Q34. As a result, the following equation can be obtained:

$$V1=V2=V3$$

where V1 is a voltage drop developing across the resistor R5, V2 is a voltage drop developing across the resistor R7, and V3 is a voltage drop developing across the resistor R9. Hence, by changing the ratio of the resistances of the resistors R5 and R6, the voltage VN7 of the node N7 can be varied. By successively changing the ratio of the resistances of the resistors R5 and R6, the voltage VN7 of the node N7 is successively changed. Hence, it is possible to successively move the straight line IX while maintaining the line parallel to the Vcc line.

Figure 16:
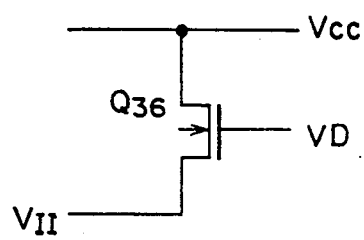
FIG. 16 is a circuit diagram of an example of the structure of a regulator unit used in the embodiments of the present invention.

FIG. 16 is a circuit diagram of the regulator unit 21. The regulator unit 21 includes an N-channel MOS transistor Q36. The external power supply voltage Vcc is applied to the drain of the transistor Q36, and the input voltage VD is applied to the gate thereof. An internal power supply voltage VII lower than the input voltage VD by the threshold voltage of the transistor Q36 is output via the source of the transistor Q36. The transistor Q36 drives a large number of elements, such as transistors, and therefore has a large driving ability. For example, the width of an area for forming the transistor W36 is $1 \times 10^5$ μm, and the length thereof is 2 μm.

Figure 17:
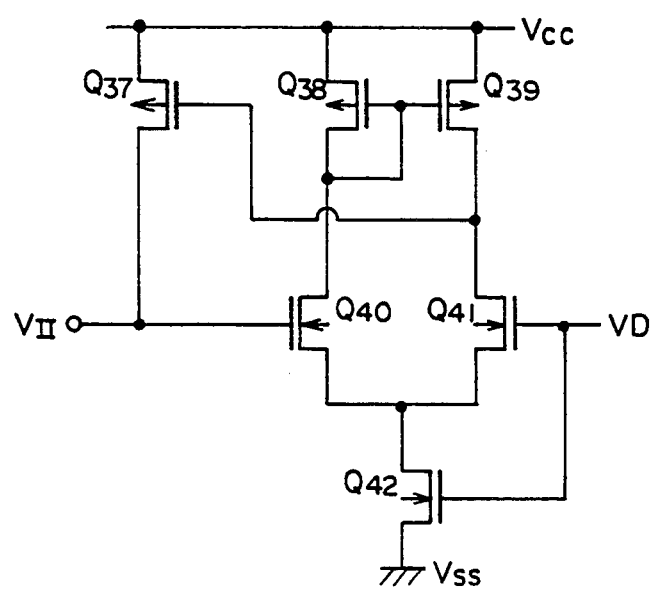
FIG. 17 is a circuit diagram of another example of the structure of the regulator unit used in the embodiments of the present invention.

FIG. 17 is a circuit diagram illustrating an alternative structure of the regulator unit 21. The regulator unit 21 shown in FIG. 17 is made up of P-channel MOS transistors Q37, Q38 and Q39, and N-channel MOS transistor Q40 and Q41. The transistors Q38 and Q39 forms a current-mirror circuit. The input voltage VD is applied to the gate of the transistor Q41, and the output voltage VII is output via the drain of the transistor Q37. When the output voltage VII varies toward the ground potential Vss, the ON resistance of the transistor Q40 increases, and the currents flowing in the transistors Q38 and Q39 decrease. Hence, the drain voltage of the transistor Q39 increases, and the ON resistance of the transistor S37 increases. Further, the drain voltage of the transistor Q37 increases, so that the output voltage VII is maintained at a constant voltage. In the circuit configuration shown in FIG. 17, the output voltage VII is equal to the input voltage VD.

The transistor Q37 drives a large number of elements, and has a large driving ability. For example, the width of an area for forming the transistor Q37 is $1 \times 10^4$ μm, and the length thereof is 2 μm. The circuit configuration using the P-channel MOS transistor 37 operates efficiently, as compared with the circuit configuration using the N-channel MOS transistor Q36.

Figure 18:
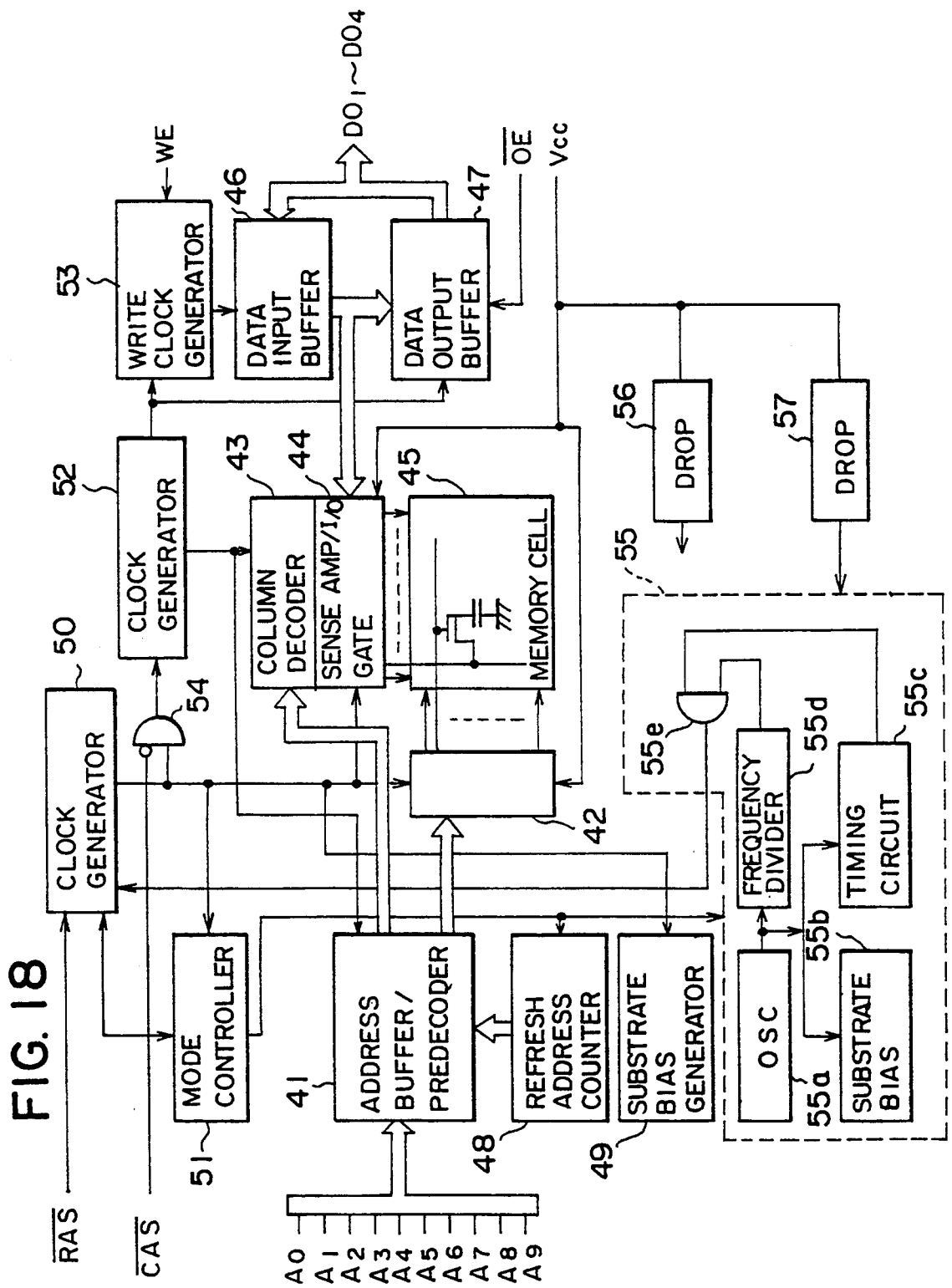
FIG. 18 is a block diagram of a semiconductor integrated circuit device to which a voltage drop power supply circuit is applied.

FIG. 18 is a block diagram of a dynamic random access memory (DRAM) device equipped with the voltage drop power supply circuit according to the present invention. The DRAM device shown in FIG. 18 includes an address buffer/predecoder 41, a row decoder 42, a column decoder 43, a sense amplifier/I/O gate 44, a memory cell array 45, a data input buffer 46 and a data output buffer 47. Further, the DRAM device includes a refresh address counter 48, a substrate bias generator 49, a clock generator 50, a mode controller 51, a clock generator 52, a write clock generator 53 and a gate circuit 54. Furthermore, the DRAM device includes a substrate bias/self-refresh circuit 55, and voltage drop power supply circuits 56 and 57. The substrate bias/self-refresh circuit 55 includes an oscillator (OSC) 55a, a substrate bias generator 55b, a timing circuit 55c, a frequency divider 55d and a gate circuit 55e.

An external address signal consisting of address bits A0–A9 is applied to the address buffer/predecoder 41. A predecoded address signal is latched in the row decoder 42 in response to a falling edge of a row address strobe signal/RAS, and is latched in the column decoder 43 in response to a falling edge of a column address strobe signal/CAS. The row decoder 42 selects one of the word lines, the column decoder 43 selects one of the bit (or data) lines. During a data write operation, data including D01–D04 is written into the memory cell array 45 via the data input buffer 46 and the sense amplifier/I/O gate 44. During a data read operation, data is read from the memory cell array 45 via the sense amplifier/I/O gate 44 and the data output buffer 47. An output enable signal/OE selectively outputs the read data. The clock generators 50 and 52, the mode controller 51, the write clock generator 53 and the gate circuit 54 control the data read and write operations. The refresh address counter 48 and the substrate bias/self-refresh circuit 55 controls a refresh operation. The substrate bias generator 55c always operates, and the substrate bias generator 49 operates only when the substrate bias greatly decreases. The voltage drop power supply circuit 57 generates a temperature-compensated dropped voltage from the external power supply voltage Vcc, and outputs it to the substrate bias/self-refresh circuit 55.

The voltage drop power supply circuit 56 has the configuration of the present invention, that is, the constant internal voltage supply unit 11, the burn-in voltage supply unit 12, and the constant internal power supply voltage releasing signal generating unit 13. In actuality, the voltage drop power supply circuit 56 includes the regulator unit 21. The output voltage of the voltage dropped power supply circuit 56 is output to the structural elements other than the data output buffer 47. The voltage drop power supply circuits 56 and 57, and the data output buffer 47 receive the external power supply voltage Vcc.

In the aforementioned embodiments, the constant reference voltage $V_{REF}$ is generated by the series circuit of the transistors Q1–Q4. However, other constant-voltage circuits can be used to generate the constant reference voltage $V_{REF}$. The present invention includes not only the DRAM devices but also SRAM devices and EPROM devices.

The present invention is not limited to the specifically disclosed embodiments, and variations and modifications may be made without departing from the scope of the present invention.

What is claimed is:

1. A method of testing a semiconductor integrated circuit device in which internal circuits of the semiconductor integrated circuit device are supplied, in a normal operation, with a constant internal power supply voltage generated from an external power supply voltage in accordance with a first characteristic line defining a relationship between the external power supply voltage and the internal power supply voltage, said method comprising the steps of:

generating a burn-in voltage from the external power supply voltage having a level higher than that used in the normal operation in accordance with a second characteristic line defining a relationship between the external power supply voltage and the internal power supply line, the second characteristic line crossing the first characteristic line at an intermediate point between lower and upper limit voltages defined by the first characteristic line, the burn-in voltage being greater than the internal power supply voltage used in the normal operation; and applying the burn-in voltage to the internal circuits of the semiconductor integrated circuit device.

2. The method as claimed in claim 1, wherein a ratio of the internal power supply voltage to the external power supply voltage defined by the first characteristic line is equal to a ratio of the burn-in voltage to the external power supply voltage defined by the second characteristic line.

3. The method as claimed in claim 1, wherein the second characteristic line includes a part of a first straight line obtained by shifting, in parallel, a second straight line connecting an origin at which the internal and external power supply lines are zero to the lower limit voltage of the first characteristic line.

4. The method as claimed in claim 1, wherein the ratio of the burn-in voltage to the external power supply voltage defined by the second characteristic line is constant.

5. A voltage drop power supply circuit for a semiconductor integrated circuit device, comprising:
first means for generating a constant internal power supply voltage from an external power supply voltage in accordance with a first characteristic line defining a relationship between the external power supply voltage and the internal power supply voltage and for applying the constant internal power supply voltage to internal circuits of the semiconductor integrated circuit device; and
second means for generating a burn-in voltage from the external power supply voltage having a level higher than that used in the normal operation in accordance with a second characteristic line defining a relationship between the external power supply voltage and the internal power supply line and for applying the burn-in voltage to the internal circuits when a burn-in test is carried out for the semiconductor integrated circuit device,
the second characteristic line crossing the first characteristic line at an intermediate point between lower and upper limit voltages defined by the first characteristic line,
the burn-in voltage being greater than the internal power supply voltage used in the normal operation.

6. The voltage drop power supply circuit as claimed in claim 5, further comprising third means for activating said second means when the external power supply voltage reaches the upper limit voltage of the first characteristic line.

7. The voltage drop power supply circuit as claimed in claim 5, wherein said first means comprises means for generating the internal power supply voltage proportional to the external power supply voltage when the semiconductor integrated circuit device performs the normal operation.

8. The voltage drop power supply circuit as claimed in claim 5, wherein said second means comprises:
third means for dividing the external power supply voltage and for generating a divided voltage;
fourth means, coupled to the third means, for generating the burn-in voltage based on the divided voltage; and
fifth means, coupled to the fourth means, for applying the burn-in voltage to the internal circuits only when the burn-in test is carried out for the semiconductor integrated circuit device.

9. The voltage drop power supply circuit as claimed in claim 8, wherein said third means comprises a plurality of resistors connected in series between a first power supply system set at the external power supply voltage and a second power supply system set at a reference potential.

10. The voltage drop power supply circuit as claimed in claim 8, wherein:
said third means comprises a level shift element and a resistor connected in series between a first power supply system set at the external power supply voltage and a second power supply system set at a reference potential; and
said divided voltage is output via a connection node at which the level shift element and the resistor are connected in series.

11. The voltage drop power supply circuit as claimed in claim 8, further comprising sixth means, coupled to said fifth means, for generating a control signal to said fifth means when the external power supply voltage reaches the upper limit voltage of the first characteristic line, said control signal activating said fifth means so that the burn-in voltage is applied to the internal circuits.

12. The voltage drop power supply circuit as claimed in claim 11, wherein said fifth means comprises a transistor having first and second terminals and a control terminal,
the first terminal receiving the burn-in voltage,
the second terminal being connected to the internal circuits of the semiconductor integrated circuit device, and
the control terminal receiving said control signal.

13. The voltage drop power supply circuit as claimed in claim 8, further comprising sixth means, coupled to said fourth means, for activating said fourth means only when the burn-in test is carried out for the semiconductor integrated circuit device.

14. A semiconductor integrated circuit device comprising:
first internal circuits operating with an external power supply voltage;
second internal circuits operating with a constant internal power supply voltage obtained by dropping the external power supply voltage;
first means for generating the constant internal power supply voltage from the external power supply voltage in accordance with a first characteristic line defining a relationship between the external power supply voltage and the internal power supply voltage and for applying the constant internal power supply voltage to the second internal circuits of the semiconductor integrated circuit device; and
second means for generating a burn-in voltage from the external power supply voltage having a level higher than that used in the normal operation in accordance with a second characteristic line defining a relationship between the external power supply voltage and the internal power supply line and for applying the burn-in voltage to the second internal circuits when a burn-in test is carried out for the semiconductor integrated circuit device,
the second characteristic line crossing the first characteristic line at an intermediate point between lower and upper limit voltages defined by the first characteristic line,
the burn-in voltage being greater than the internal power supply voltage used in the normal operation.

15. The voltage drop power supply circuit as claimed in claim 14, further comprising third means for activating said second means when the external power supply voltage reaches the upper limit voltage of the first characteristic line.

16. The voltage drop power supply circuit as claimed in claim 14, wherein said first means comprises means for generating the internal power supply voltage proportional to the external power supply voltage when the semiconductor integrated circuit device performs the normal operation.

17. The voltage drop power supply circuit as claimed in claim 14, wherein said second means comprises:

third means for dividing the external power supply voltage and for generating a divided voltage;

fourth means, coupled to the third means, for generating the burn-in voltage based on the divided voltage; and fifth means, coupled to the fourth means, for applying the burn-in voltage to the second internal circuits only when the burn-in test is carried out for the semiconductor integrated circuit device.

* * * * *